United States Patent [19]
Kim

[11] Patent Number: 5,648,775
[45] Date of Patent: Jul. 15, 1997

[54] HIGH SPEED VARIABLE LENGTH CODE DECODING APPARATUS

[75] Inventor: Gyu-Seok Kim, Seoul, Rep. of Korea

[73] Assignee: Daewoo Electronics Co., Ltd., Seoul, Rep. of Korea

[21] Appl. No.: 560,088

[22] Filed: Nov. 17, 1995

[30] Foreign Application Priority Data

Nov. 17, 1994 [KR]  Rep. of Korea ................. 94-30161

[51] Int. Cl.⁶ .................................................. H03M 7/40
[52] U.S. Cl. ................................................ 341/67; 341/106
[58] Field of Search ............................ 341/67, 63, 64, 341/65, 106, 55

[56] References Cited

U.S. PATENT DOCUMENTS

| | | | |
|---|---|---|---|
| 4,899,149 | 2/1990 | Kahan | 341/67 |
| 5,173,695 | 12/1992 | Sun et al. | 341/67 |
| 5,245,338 | 9/1993 | Sun | 341/67 |

Primary Examiner—Brian K. Young
Attorney, Agent, or Firm—Pennie & Edmonds LLP

[57] ABSTRACT

A variable length code decoding apparatus for decoding sequential variable length codewords includes a bit shifting circuit for providing a window output sequence of the two fixed length segments stored in latch circuits, a bit generation circuit for generating an N-bit output sequence by using the window output sequence as low-order bits of the N-bit output sequence, a decoding sequence generation circuit for producing a decoding output sequence of the two fixed length segments in response to the codeword length signal, a table memory device for producing fixed length codewords in response to a variable length codeword that begins at the first bit position of the decoding output sequence and for producing codeword lengths corresponding to the decoded variable length codewords, an output selection circuit for selecting an output codeword and a codeword length among the produced fixed length codewords and codeword lengths corresponding to the decoded variable length codewords, in response to an output selection signal generated by a variable length decoding control block, and a carry signal generation means for generating the position control signal.

2 Claims, 3 Drawing Sheets

FIG. 2

| 0001 | 1011 | 0111 | 0111 | 1011 | 1110 | 1111 | 1101 | 1101 | 1110 |

FIG. 3

| | SHIFTER 115 OUTPUT | LATCH 113 | OR 111 | BIT GENE-RATION 109 OUTPUT | BIT SHIFTING 107 OUTPUT | LATCH 105 | LATCH 103 | READ LATCH | CODE-WORD LENGTH | DECODED WORD |
|---|---|---|---|---|---|---|---|---|---|---|
| 1 | 0001 1011<br>0111 0111 | | | | | 1011<br>1110 | 1111<br>1101 | 0 | 0 | O |
| 2 | 0110 1101 1101 1100<br>0110 1101 1101 1110 | 0110 1101 1101 1100<br>0110 1101 1101 1110 | 1101<br>1110 | 0000<br>0010 | 10 | 1011<br>1110 | 1111<br>1101 | 0 | 2 | A |
| 3 | 1011 0111 1110<br>1011 0111 1011 | 1011 0111 1000<br>1011 0111 1011 | 0111<br>1011 | 0000<br>0011 | 11 | 1011<br>1110 | 1111<br>1101 | 0 | 2 | B |
| 4 | 1110 1111 0000<br>0110 0000 0110 | 1111 0000<br>1111 1101 | 0111<br>1101 | 0001<br>1101 | 11101 | 1011<br>1110 | 1111<br>1101 | 0 | 5 | C |
| 5 | 1111 1111 0111<br>1101 0000 0111 | 1111 1101 0000<br>1111 1101 1111 | 1101<br>1111 | 0000<br>1111 | 1111 | 1111<br>1101 | 1101<br>1110 | 1 | 4 | D |

HIGH SPEED VARIABLE LENGTH CODE DECODING APPARATUS

FIELD OF THE INVENTION

The present invention relates to a variable length code (VLC) decoding apparatus; and, more particularly, to an improved VLC decoding apparatus which is capable of providing a high speed decoding operation by effectively reducing the operational delay of a table-lookup process thereof.

DESCRIPTION OF THE PRIOR ART

Variable length coding is a technique often used for lossless data compression. This technique is used to convert fixed-length data to variable-length codewords based on the statistical occurrences of the data. The codeword lengths are chosen in such a manner that shorter codewords are used to represent more frequently occurring data and longer codewords are selected to represent less frequently occurring data. By properly assigning the variable-length codewords to a library of all possible source codewords, the average word length of the variable-length codewords becomes shorter than that of the original data, thereby rendering it possible to achieve data compression.

In this connection, Huffman code design is a procedure commonly used to construct a minimum redundant variable length code for a known data statistic. In general, the encoding process can be implemented by a table-lookup process using input data to address the table. The codewords and the wordlength information are stored as contents of the table and outputted sequentially through the use of a buffer at a constant data rate onto the data channel.

At the receiving end, however, the decoding process is more complicated. Owing to the nature of varying length, each codeword has to be segmented from the received bit string before it can be decoded into a source symbol. Therefore, the design of a variable word length decoder is more difficult than that of a variable length encoder.

There are several known apparatus for use to decode a stream of variable length codewords. Among them, most often used is a VLC decoder employing a tree-searching algorithm such as the one disclosed in U.S. Pat. No. 4,899,149 issued on Feb. 6, 1990 to Gary Kahan. In this device, a variable length code is represented by a tree with codewords as leaves(also called terminal nodes). The decoding process starts from the root of the code tree and is guided by the received bit stream to follow one of two branches at each node. When a leaf is reached, the end of a codeword is detected and is segmented from the remaining bit stream. This type of decoding apparatus includes a logic circuitry corresponding to the tree and a control circuitry to traverse the code tree. This approach may be slow, however, especially for long codewords, since a bit-by-bit search through the code tree is required for each decoded symbol.

One of the VLC decoders introduced to enhance the speed of operation thereof is a lookup-table based variable length decoder such as the one disclosed in U.S. Pat. No. 5,173,695 issued on Dec. 22, 1992 to Ming-Ting Sun, et al.; and U.S. Pat. No. 5,245,338 to Ming-Ting Sun. That decoder includes two cascaded latch circuits, each having a bit capability equal to the maximum codeword length, which store consecutive bits supplied from an input buffer memory for storing the stream to be decoded in fixed-length data segments; a barrel shifter connected to the two latch circuits for providing a sliding decoding window output equal in length to the maximum codeword length; an accumulator which accumulates, modulo the maximum codeword length, the lengths of sequentially decoded variable length codewords; and a lookup-table memory device for outputting a fixed-length word corresponding to a variable-length codeword contained in the sliding decoding window output and for outputting a length of the variable-length codeword. As a codeword is decoded during each clock cycle, its length is accumulated and the decoding window of the barrel shifter is shifted to begin with the first bit of a next codeword to be decoded. When, during a clock cycle, the accumulated length exceeds the maximum codeword length, which would indicate that all the bits in the second latch circuit have been decoded, the bits in the first latch circuit are transferred into the second latch circuit and a next fixed-data segment of bits is read into the first latch circuit from the input buffer memory.

Even though this apparatus may enhance the speed of operation thereof through the lookup-table based variable length decoding, it is incapable of reducing the table-lookup delay, having a deleterious effect on high-speed decoding required in, e.g., high definition television systems, thus unable to provide a VLC decoding which fully reduces the operational delay.

SUMMARY OF THE INVENTION

It is, therefore, a primary object of the invention to provide a VLC decoding apparatus which is capable of reducing the operational delay of a table-lookup process, thereby advantageously achieving a high speed decoding operation.

In accordance with the present invention, a variable length code decoding apparatus for decoding, at a fixed clock rate, sequential variable length codewords supplied from an input buffer which stores an input bit stream to be decoded in fixed length segments having a length equal to a longest length of the variable length codewords, said apparatus comprising: first and second latch circuits, in response to a read signal, for storing consecutively two fixed length segments from the input buffer; a bit shifting circuit connected to the first and the second latch circuits and having an output window for providing an M-bit window output sequence of the two fixed length segments, M being variable from 0 to one half of the longest length of the variable length codewords and said output window being shifted in direct response to a position control signal and a codeword length signal, wherein the position control signal indicates a bit position in the two fixed length segments from which the window output sequence begins and the codeword length signal indicates how many bits are to be included in the window output sequence; a bit generation circuit for generating an N-bit output sequence by using the window output sequence as low-order bits of the N-bit output sequence, N being one-half of the longest length of the variable length codewords; a decoding sequence generation circuit connected to the bit generation circuit for producing a decoding output sequence of the two fixed length segments in response to the codeword length signal; a memory device coupled to the decoding sequence generation circuit and having a number of lookup-tables for producing fixed length codewords in response to a variable length codeword that begins at the first bit position of the decoding output sequence and for producing codeword lengths corresponding to the decoded variable length codewords; a variable length decoding control block for generating an output selection signal and a clock signal; an output selection circuit for selecting an output codeword and a codeword length among the produced fixed length codewords and codeword lengths corresponding to the decoded variable length codewords, in response to the clock signal and the output selection signal; a carry signal generator for generating the position control signal represented by adding "1" to a previously accumulated codeword length, and for accumulating the selected codeword length with the previously accumulated codeword length, the carry signal generator generating the read signal to retrieve a next fixed length segment stored in the input buffer when the previously accumulated codeword length is greater than one-half of the longest length of the variable length codewords, the next fixed length segment being stored in the first latch circuit and the fixed length segment previously stored in the first latch circuit being transferred to the second latch circuit.

BRIEF DESCRIPTION OF THE DRAWINGS

The above and other objects and features of the instant invention will become apparent from the following description of preferred embodiments taken in conjunction with the accompanying drawings, in which:

FIG. 2 depicts the input bit stream used for explaining the operation for the VLC decoding apparatus shown in FIG. 1; and FIG. 3 provides an explanatory diagram for illustrating the operation of the VLC decoding apparatus shown in FIG. 1.

DETAILED DESCRIPTION OF THE PREFERRED EMBODIMENTS

Figure 1:
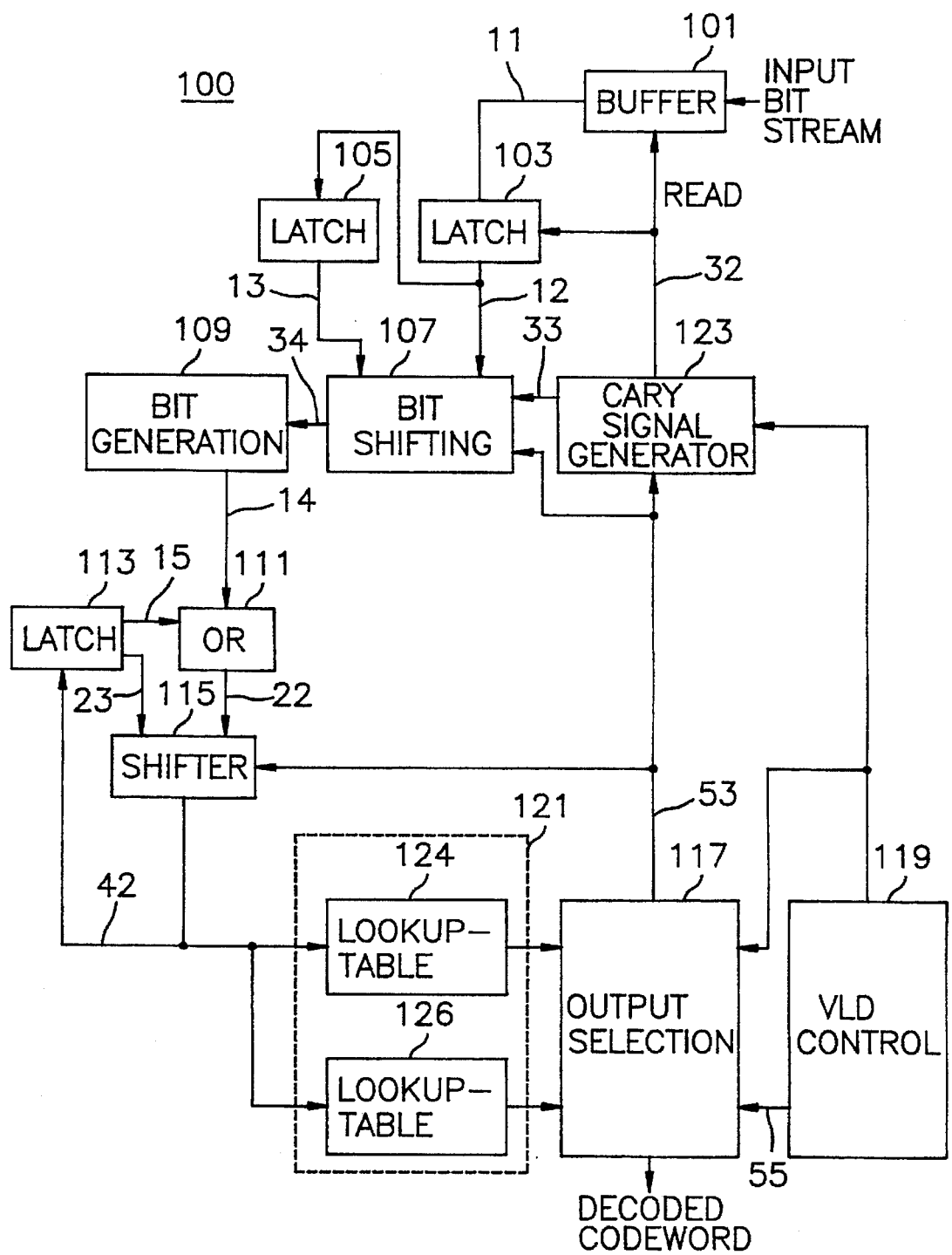
FIG. 1 shows a schematic diagram of a VLC decoding apparatus in accordance with the present invention.

A VLC decoder in accordance with a preferred embodiment of the present invention is shown in FIG. 1. For illustrative purposes, it is assumed that the maximum length of the variable-length codeword to be decoded is 16 bits. The VLC decoder 100 decodes successive variable length codewords inputted thereto in a continuous bit stream and outputs decoded fixed length codewords corresponding thereto, at a fixed symbol clock.

A serial data stream received on a data channel 52 is inputted to an input buffer memory 101 which stores, in fixed-length data segments, the serial data stream variable-length words and sequentially outputs fixed length data segments, e.g., 8-bit segments on a lead 11 in response to a READ signal on a lead 32, wherein the bit length of the data segment is one-half of the maximum bit length of the variable length codewords.

A latch circuit 103 is connected to the input buffer memory 101 and serves to sequentially receive the fixed-length data segments in response to the READ signal on the lead 32.

A latch circuit 105 is connected to the latch circuit 103 and functions to receive the fixed-length data segment previously held in the latch circuit 103. When a new data segment needs to be supplied, a READ signal is activated on the lead 32. Each time the READ signal on the lead 32 is activated, the buffer memory 101 supplies a next data segment onto the lead 11; the latch circuit 103 receives the next data segment; the data segment previously held in the latch circuit 103 is transferred to the latch circuit 105; and the data segment in the latch 105 is dumped. The latch circuit 105 thus always contains the data segment which is sequentially earlier in time than the data segment contained in the latch circuit 103. The two data segments contained in the two latch circuits 103 and 105 comprise a 16-bit sequence of the serial input data, which is identical to the size of the maximum length codeword.

The two data segments in latch circuits 103 and 105 are inputted to a bit shifting circuit 107 over parallel leads 12 and 13, respectively. That is, the bits in this new segment are concatenated with the bits in the previous segment and then transferred into the bit shifting circuit 107. The output of the bit shifting circuit 107 on a lead 34 is an M-bit window output sequence of the two input data segments, i.e., the previous data segment outputted from the latch circuit 105 and the current data segment outputted from the latch circuit 103, M being a variable number between 0 and one-half of the maximum length codeword, i.e., "8". The M-bit output window is slidable across the 16-bit input to the bit shifting circuit 107 and its position is directly determined according to a position control signal on a lead 33 and a codeword length on a lead 53, wherein the position control signal indicates a bit position in the stored two data segments from which the window output sequence begins, and the codeword length indicates how many bits are to be included in the window output sequence. The M-bit window output sequence on the lead 34 is then coupled to a bit generation circuit 109 which serves to generate an 8-bit output sequence through the use of the M-bit window output sequence. That is, the bit generation circuit 109 generates an 8-bit output sequence by using the window output sequence as low-order bits of the 8-bit output sequence. The 8-bit output sequence on a lead 14 from the bit generation circuit 109 is coupled to an OR circuit 111 which is also coupled to a 16-bit latch circuit 113 over a lead 15. The latch circuit 113 latches the decoding output sequence on a lead 42 from the shifter 115 and is divided into a low-order 8-bit sequence and a high-order 8-bit sequence. The divided low-order and high-order bit sequences of the decoding output sequence are fed to the OR circuit 111 and the shifter 115 over leads 15 and 23, respectively, in order to produce a next decoding output sequence. The OR circuit 111 performs a logic OR operation for two inputs thereof, i.e., the 8-bit output sequence on the lead 14 from the bit generation circuit 109 and the low-order 8-bit sequence of the decoding output sequence on the lead 15 from the latch circuit 113, and generates the logic OR operated bit sequence onto a lead 22. The high-order bit sequence of the decoding output sequence and the logic OR operated bit sequence on the respective leads 22 and 23 are then simultaneously coupled to the shifter 115. The shifter 115 directly shifts in a high-order direction the 16-bit sequence applied thereto in response to the codeword length on the lead 53. The codeword length informs the shifter how many bits it should take from the most significant bit(MSB) of the bit sequence. Thus, the shifter 115 takes and removes a number of bits equivalent to the value of the codeword length beginning from the MSB of the bit sequence. Thereafter, the sequence is shifted so that each bit in the bit sequence is moved towards the MSB by the value of the codeword length, and the space, created in the least significant bit(LSB) of the bit sequence by the bits being shifted, is filled by zeros. This new bit sequence is then sent out as the output sequence by the shifter onto the lead 42.

The output of the shifter 115 is connected on the lead 42 to a memory device 121 which comprises several lookup-tables for providing macroblock addresses, macroblock types, macroblock patterns, motion vectors, and DCT coefficients, wherein each of the lookup-tables includes a codeword table AND plane, a word length table OR plane and a decoded word table OR plane. For the sake of simplicity, the memory device 121 shown in FIG. 1 is chosen to have two lookup-tables 124 and 126.

As is well known, each codeword is represented as an entry in the codeword table AND plane according to the bit pattern of the codeword. Since most codewords in a codeword library, which has the maximum word length capacity of 16 bits, have fewer than 16 bits, the bit positions of the output from the shifter, beyond the actual codeword bit pattern in the codeword table, are designated as "don't care" positions. A codeword is detected when a sequence from the shifter 115 matches one of the codeword bit patterns stored in the codeword table AND plane. Thus, for example, if one of the variable-length codeword bit patterns is "00", and the 16-bit sequence outputted from the shifter 115 has a pattern "0001 1011 0111 0111", then a match occurs on the first two bits. The first two bits are thus recognized as a variable-length codeword and the next word begins with the third bit.

When the decoding output sequence on the lead 42 matches an entry in each of the codeword table AND planes, the entry in each of the word length table OR planes and the entry in each of the decoded word table OR planes are activated. Each of the decoded word table OR planes outputs the decoded fixed length words corresponding to the matched variable length codewords in each of the codeword table AND planes to an output selection block 117. And, each word length table OR plane generates a word length signal to the output selection block 117, wherein the word length signal indicates the length of the matched variable length codeword in each codeword table. The output selection block 117, in response to an output selection signal and a clock signal generated from a variable length decoding (VLD) control block 119, selects one of two fixed length codewords and their word lengths corresponding to the fixed length codewords, from the lookup-tables 124 and 126, and provides the selected codeword and its word length onto the respective leads 54 and 53. In case of the example given above, the word length tables output "2", representing the length of the detected word "00". In accordance with the invention, this codeword length on the lead 53 is directly coupled to the shifter 115 in order to generate an output sequence in advance for carrying out a table-lookup process. The codeword length on the lead 53 is also inputted into a carry signal generator 123. In response to the clock signal from the VLD control block 119, the carry signal generator 123 generates the position control signal represented by adding "1" to the previously accumulated modulo 8 codeword length stored therein; and accumulates the codeword length on the lead 53 with the previously accumulated modulo 8 codeword length.

When the previously accumulated modulo 8 codeword length exceeds 7, the carry signal generator 123 activates a READ signal. This READ signal of "1" is outputted on the lead 32 to the input buffer memory 101 and the latch circuit 103 in order to bring the next 8-bit data segment in the input buffer memory 101 into the latch circuit 103 while transferring the contents of the latch circuit 103 to the latch circuit 105.

The operation of the decoder in FIG. 1 may be more readily understood with reference to an example shown in tabular form in FIGS. 2 and 3. It is assumed that the data stream inputted from the data channel 52 to the input buffer memory 101 shown in FIG. 1 consists of the bit stream "0001 1011 0111 0111 1011 1110 1111 1101 1101 1110 . . . ", as shown in FIG. 2.

Referring to FIG. 3, prior to the first clock tick, the shifter 115 is provided with the first and the second data segments, i.e., "0001 1011 0111 0111", to be decoded; the fourth data segment, i.e., "1011 1110", is inputted to the latch circuit 105; and the fifth data segment, i.e., "1111 1101", is fed to the latch circuit 103. At this time, the outputs of the latch circuits 103 and 105, the outputs of the shifter 115, and the outputs of the memory device 117 are of noise values.

At the first clock tick, a sequence of "0001 1011 0111 0111" is simultaneously provided, as a decoding output sequence, from a shifter 115 to a latch circuit 113 and a memory device 121 over a lead 42. Two lookup-tables 124 and 126 within the memory device 121 recognize the first two bits, i.e., "00" in the decoding output sequence as decoded words, for example, "A" and "A'", and output these fixed length decoded words, A and A', to the output selection block 117, respectively. Each of the lookup-tables also outputs the length of "00" to the output selection block 117.

At the second clock tick, the output selection block 117, in response to the output selection signal and a clock signal from a VLD control block 119, outputs one of the two decoded words A and A', e.g., A, as the decoded codeword, and the codeword length, i.e., "2", corresponding to the decoded codeword, onto the leads 54 and 53, respectively. In response to the codeword length on the lead 53, the shifter 115 directly removes a number of bits equivalent to the value of the codeword length beginning from the MSB of the bit sequence of "0001 1011 0111 0111" stored therein. Thereafter, the sequence is shifted so that each bit in the bit sequence is moved towards the MSB by the value of the codeword length, and the space created in the least significant bit(LSB) of the bit sequence by the bits being shifted, is filled by zeros. This new bit sequence of "0110 1101 1101 1100" is then sent out as output sequence by the shifter onto the lead 42. In accordance with the present invention, the new bit sequence on the lead 42 is simultaneously coupled to a latch circuit 113 and the memory device 121 in order to produce a next decoding output sequence and to carry out a table-lookup process while a carry signal generator 123, a bit shifting circuit 107 and a bit generation circuit 109 are operated. The carry signal generator 123, in response to the clock signal from the VLD control block 119, generates a position control signal, represented by adding "1" to the previously accumulated modulo 8 word length stored therein, to the bit shifting circuit 107; and accumulates the codeword length of "00" on the lead 53 with the previously accumulated modulo 8 word length, wherein the previously accumulated modulo 8 word length is "0". In a preferred embodiment of the present invention, the bit shifting circuit 107 generates a window output sequence in response to the position control signal and the codeword length on the lead 53, wherein the window output sequence begins with a bit in the data segment from two latch circuits 103 and 105, indicated by the position control signal, and the length of the window output sequence is equal to the codeword length on the lead 53. Therefore, the bit shifting circuit 107 generates "10" in the data segment of "1011 1110 1111 1101" as the window output sequence since the position control signal is "1" and the codeword length on the lead 53 is "2". The 2-bit sequence of "10" is then coupled to the bit generation circuit 109. The bit generation circuit 109 generates a 8-bit output sequence by using the window output sequence as a low-order sequence of the 8-bit output sequence. That is, the bit generation circuit 109 generates, as the 8-bit output sequence, "0000 0010" by using the window output sequence, i.e., "10" from the bit shifting circuit 107 as the low-order sequence of the 8-bit output sequence. The OR circuit 111 performs a logic OR operation for its two inputs, i.e., the 8-bit output sequence of "0000 0010" on the lead 14 from the bit generation circuit 109 and a low-order 8-bit sequence in the 16-bit sequence of "0110 1101 1101 1100" latched in the latch circuit 113, i.e., "1101 1100", on the lead 15; and generates the logic OR operated bit sequence, i.e., "1101 1110" onto the lead 22. The latch circuit 113 also provides a high-order 8-bit sequence in the 16-bit sequence therein, i.e., "0110 1101" onto a lead 23. The high-order 8-bit sequence and the logic OR operated bit sequence on the respective leads 23 and 22 are then simultaneously coupled to the shifter 115 which transfers "0110 1101 1101 1110" as the decoding output sequence on a lead 42. The decoding output sequence on the lead 42 is coupled into the latch circuit 113 and the memory device 121 over the lead 42. The memory device 121 recognizes the first two bits, i.e., "01" in the decoding output sequence of "0110 1101 1101 1110" as decoded words, for example, "B" and "B'", and outputs these fixed length decoded words, B and B', to the output selection block 117. The memory device 121 also outputs the length of "01" to the output selection block 117.

At the third clock tick, the output selection block 117, in response to the output selection signal and the clock signal from the VLD control block 119, outputs one of the two decoded words B and B', e.g., B, as the decoded codeword and the codeword length, i.e., "2", corresponding to the decoded codeword, onto the leads 54 and 53, respectively. The shifter 115 directly removes two bits, i.e., "01", beginning from the MSB of the bit sequence of "0110 1101 1101 1110" stored therein, in response to the codeword length on the lead 53; and provides the next bit sequence of "1011 0111 0111 1000" onto the lead 42. In response to the clock signal from the VLD control block 119, the carry signal generator 123 generates the position control signal indicating the third bit position in the data segment of "1011 1110 1111 1101" in the bit shifting circuit 107 onto a lead 33 since the previously accumulated modulo 8 word length is "2"; and accumulates the codeword length of "01" on the lead 53 with the previously accumulated modulo 8 word length, i.e., "2". The bit shifting circuit 107 generates, as the window output sequence, "11" onto the lead 34 because the output window is shifted to encompass the third bit through the fourth bit in the data segment of "1011 1110 1111 1101" in response to the position control signal and the codeword length, i.e., "2", on the lead 53. The 2-bit sequence of "11" is then coupled to the bit generation circuit 109. The bit generation circuit 109 generates, as the 8-bit output sequence, "0000 0011" onto the lead 14 by using "11" from the bit shifting circuit 107 as the low-order sequence of the 8-bit output sequence. The OR circuit 111 performs a logic OR operation for its two inputs, i.e., "0000 0011" on the lead 14 and a low-order 8-bit sequence in the 16-bit sequence of "1011 0111 0111 1000" in the latch circuit 113, i.e., "0111 1000", on the lead 15; and generates the logic OR operated bit sequence, i.e., "0111 1011" onto the lead 22. The latch circuit 113 also provides a high-order 8-bit sequence in the 16-bit sequence therein, i.e., "1011 0111" onto a lead 23. The high-order 8-bit sequence and the logic OR operated bit sequence on the respective leads 23 and 22 are then simultaneously coupled to the shifter 115 which transfers "1011 0111 0111 1011" as the decoding output sequence on the lead 42. The decoding output sequence on the lead 42 is coupled to the latch circuit 113 and the memory device 121 over the lead 42. The memory device 121 recognizes the first five bits, i.e., "10110", in the decoding output sequence, i.e., "1011 0111 0111 1011", as decoded words, for example, "C" and "C'", and outputs these fixed length decoded words, C and C', to the output selection block 117. The memory device 121 also outputs the length of "10110" to the output selection block 117.

At the fourth clock tick, the output selection block 117, in response to the output selection signal and the clock signal from the VLD control block 119, outputs one of the two decoded words C and C', e.g., C, as the decoded codeword and the codeword length, i.e., "5", corresponding to the decoded codeword, onto the leads 54 and 53, respectively. The shifter 115 directly removes five bits, i.e., "10110" beginning from the MSB of the bit sequence of "1011 0111 0111 1011" stored therein, in response to the codeword length of "5" on the lead 53; and provides the new bit sequence of "1110 1111 0110 0000" onto the lead 42. The carry signal generator 123, in response to the clock signal from the VLD control block 119, generates the position control signal indicating the fifth bit position in the data segment of "1011 1110 1111 1101" in the bit shifting circuit 107 onto the lead 33 since the previously accumulated modulo 8 word length is "4"; and accumulates the codeword length of "10110" on the lead 53 with the previously accumulated modulo 8 word length, i.e., "4". The bit shifting circuit 107 generates, as the output sequence, "11101" onto the lead 34 because the output window is shifted to encompass the fifth bit through the ninth bit in the data segment of "1011 1110 1111 1101" in response to the position control signal and the codeword length, i.e., "5" on the lead 53. The 5-bit sequence of "11101" is then coupled to the bit generation circuit 109. The bit generation circuit 109 generates "0001 1101", as the 8-bit output sequence, onto the lead 14 by using "11101" from the bit shifting circuit 107 as the low-order sequence of the 8-bit output sequence. The OR circuit 111 performs a logic OR operation for its two inputs, i.e., "0001 1101" on the lead 14 and a low-order 8-bit sequence in the 16-bit sequence of "1110 1111 0110 0000" latched in the latch circuit 113, i.e., "0110 0000", on the lead 15; and generates the logic OR operated bit sequence, i.e., "0111 1101" onto the lead 22. The latch circuit 113 also provides a high-order 8-bit sequence in the 16-bit sequence therein, i.e., "1110 1111" onto the lead 23. The high-order 8-bit sequence and the logic OR operated bit sequence on the respective leads 23 and 22 are then simultaneously coupled to the shifter 115. The shifter 115 provides "1110 1111 0111 1101" as the decoding output sequence on the lead 42. The decoding output sequence on the lead 42 is coupled to the latch circuit 113 and the memory device 121 over the lead 42. The memory device 121 recognizes the first four bits, i.e., "1110" in the decoding output sequence, i.e., "1110 1111 0111 1101", as decoded words, for example, "D" and "D'", and outputs these fixed length decoded words, D and D', to the output selection block 117. The memory device 121 also outputs the length of "1110 to the output selection block 117.

At the fifth clock tick, the output selection block 117, in response to the output selection signal and the clock signal from the VLD control block 119, outputs one of the two decoded words D and D', e.g., D, as the decoded codeword and the codeword length, i.e., "4", corresponding to the decoded codeword, onto the leads 54 and 53, respectively. The shifter 115 directly removes four bits, i.e., "1110", beginning from the MSB of the bit sequence of "1110 1111 0111 1101" stored therein, in response to the codeword length of "4" on the lead 53; and provides the new bit sequence of "1111 0111 1101 0000" onto the lead 42. The carry signal generator 123 activates the READ signal since the previously accumulated codeword length is greater than "7". At this READ signal, a next data segment of "1101 1110" is retrieved from the input buffer memory 101 and latched as a current data segment into the latch circuit 103; and the data segment of "1111 1101" previously latched in the latch circuit 103 is transferred as a previous data segment into the latch circuit 105. The current and previous data segments are simultaneously coupled into the bit shifting circuit 107 which transfers the window output sequence of "1111", beginning with the second bit in the previous data segment, on a lead 34 since the previously accumulated modulo 8 word length is "9(modulo 8+1). The 4-bit sequence of "1111" is then coupled to the bit generation circuit 109 which generates "0000 1111", as the 8-bit output sequence, onto the lead 14 by using "1111" from the bit shifting circuit 107 as the low-order sequence of the 8-bit output sequence. The OR circuit 111 performs a logic OR operation for its two inputs, i.e., "0000 1111" on the lead 14 and a low-order 8-bit sequence in the 16-bit sequence of "1111 0111 1101 0000" latched in the latch circuit 113, i.e., "1101 0000", on the lead 15; and generates the logic OR operated bit sequence, i.e., "1101 1111" onto the lead 22. The latch circuit 113 also provides a high-order 8-bit sequence in the 16-bit sequence therein, i.e., "1111 0111" onto the lead 23. The high-order 8-bit sequence and the logic OR operated bit sequence on the respective leads 23 and 22 are then simultaneously coupled to the shifter 115. The shifter 115 provides "1111 0111 1101 1111" as the decoding output sequence on the lead 42.

As may be seen from the above, it should be readily appreciated that since the table-lookup process in the memory device 121 is carried out while the operations of a carry signal generator 123, a bit shifting circuit 107 and a bit generation circuit 109 are performed, the VLC decoding apparatus of the present invention provides a further reduction in operational delay, thereby advantageously achieving a high speed decoding operation.

While the present invention has been shown and described in connection with the preferred embodiments only, it will be readily apparent to those of ordinary skill in the art that many changes and modifications may be made without departing from the spirit and scope of the invention as defined in the appended claim.

What is claimed is:

1. A variable length code decoding apparatus for decoding, at a fixed clock rate, sequential variable length codewords supplied from an input buffer which stores an input bit stream to be decoded in fixed length segments having a length equal to a longest length of the variable length codewords, said apparatus comprising:

first and second bit storage means, in response to a read signal, for storing consecutively two fixed length segments from the input buffer;

a bit shifting means connected to the first and the second bit storage means and having an output window for providing an M-bit window output sequence of the two fixed length segments, M being a number varying from 0 to one-half of the longest length of the variable length codewords and the output window being shifted in direct response to a position control signal and a codeword length signal, wherein the position control signal indicates a bit position in the two fixed length segments from which the window output sequence begins and the codeword length signal indicates how many bits are to be included in the window output sequence;

a bit generation means for generating an N-bit output sequence by using the window output sequence as low-order bits of the N-bit output sequence, N being one-half of the longest length of the variable length codewords;

a decoding sequence generation means connected to the bit generation means for producing a decoding output sequence of the two fixed length segments in response to the codeword length signal;

a memory means coupled to the decoding sequence generation means and having a number of lookup-tables for producing fixed length codewords in response to a variable length codeword that begins at the first bit position of the decoding output sequence and for producing codeword lengths corresponding to the decoded variable length codewords;

a control means for generating an output selection signal and a clock signal;

a selection means for selecting an output codeword and a codeword length among the produced fixed length codewords and codeword lengths corresponding to the decoded variable length codewords, in response to the clock signal and the output selection signal;

a carry signal generation means for generating the position control signal represented by adding "1" to a previously accumulated codeword length, and for accumulating the selected codeword length with the previously accumulated codeword length, the generation means generating the read signal to retrieve a next fixed length segment stored in the input buffer when the previously accumulated codeword length is greater than one-half of the longest length of the variable length codewords, the next fixed length segment being stored the first bit storage means and the fixed length segment previously stored in the first bit storage means being transferred to the second bit storage means.

2. The apparatus according to claim 1, wherein said decoding sequence generation means includes:

means for latching and dividing the decoding output sequence into a low-order bit sequence and a high-order bit sequence;

means for providing a logic OR operated bit sequence by performing a logic OR operation for the low-order bit sequence and the bit output sequence generated from the bit generation means; and means for receiving the logic OR operated bit sequence and the high-order bit sequence, and directly shifting in a high-order direction the received bit sequence in response to the codeword length indicating the receiving means how many bits it should take from the most significant bit(MSB) of the received bit sequence, the receiving means removing the shifted bits and filling the space, created in the least significant bit(LSB) of the received bit sequence by the bits being shifted, with zeros to produce a new bit sequence; and providing the new bit sequence as a next output sequence.

* * * * *